US008264868B2

(12) United States Patent
Ribeiro et al.

(10) Patent No.: US 8,264,868 B2
(45) Date of Patent: Sep. 11, 2012

(54) MEMORY ARRAY WITH METAL-INSULATOR TRANSITION SWITCHING DEVICES

(75) Inventors: Gilberto Medeiros Ribeiro, Menlo Park, CA (US); Matthew D. Pickett, San Francisco, CA (US); Jianhua Yang, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 148 days.

(21) Appl. No.: 12/911,283

(22) Filed: Oct. 25, 2010

(65) Prior Publication Data

US 2012/0099362 A1     Apr. 26, 2012

(51) Int. Cl.
*G11C 11/00* (2006.01)
(52) U.S. Cl. ......................... 365/148; 365/158; 365/171
(58) Field of Classification Search .................. 365/148, 365/158, 171
See application file for complete search history.

(56) References Cited

U.S. PATENT DOCUMENTS

| | | | |
|---|---|---|---|
| 6,984,856 B1 * | 1/2006 | Ikegawa et al. | 257/292 |
| 7,558,099 B2 | 7/2009 | Morimoto | |
| 7,580,276 B2 * | 8/2009 | Sawa et al. | 365/148 |
| 7,696,812 B2 | 4/2010 | Al-Shamma et al. | |
| 7,745,808 B2 | 6/2010 | Campbell | |
| 2004/0245557 A1 | 12/2004 | Seo et al. | |
| 2006/0157679 A1 | 7/2006 | Scheuerlein | |
| 2006/0250837 A1 | 11/2006 | Herner et al. | |
| 2006/0289942 A1 | 12/2006 | Horii et al. | |
| 2009/0027976 A1 | 1/2009 | Brewer et al. | |
| 2010/0157658 A1 | 6/2010 | Schloss et al. | |

* cited by examiner

*Primary Examiner* — Son Dinh

(57) ABSTRACT

A memory array with Metal-Insulator Transition (MIT) switching devices includes a set of row lines intersecting a set of column lines and a memory element disposed at an intersection between one of the row lines and one of the column lines. The memory element includes a switching layer in series with an MIT material. A method of accessing a target memory element within a memory array includes applying half of an access voltage to a row line connected to the target memory element, the target memory element comprising a switching layer in series with an MIT material, and applying an inverted half of the access voltage to a column line connected to the target memory element.

19 Claims, 7 Drawing Sheets

700

Apply half of an access voltage to a row line connected to a target memory element, the target memory element comprising a switching layer in series with an MIT material
(block 702)

Apply an inverted half of the access voltage to a column line connected to the target memory element
(block 704)

Detect the electric current flowing through the target memory element to determine the state of the target memory element
(block 706)

*Fig. 7*

MEMORY ARRAY WITH METAL-INSULATOR TRANSITION SWITCHING DEVICES

STATEMENT OF GOVERNMENT INTEREST

This invention has been made with U.S. government support. The U.S. government has certain rights in the invention.

BACKGROUND

As the use of digital data increases, the demand for faster, smaller, and more efficient memory structures increases. One type of memory structure that has recently been developed is a crossbar memory array. A crossbar memory array includes a set of upper parallel wires which intersect a set of lower parallel wires. A programmable memory element configured to store digital data is placed at each intersection of the wires.

A memory array utilizing crossbar architecture is subject to a number of design constraints. One of these constraints limits the number of memory elements which can be placed along a particular wire within the memory array. The number of memory elements is constrained because having too many memory elements along a particular wire makes it more difficult to isolate a particular memory element for reading and writing operations.

For example, particular memory elements within a crossbar array are often read by applying half of a read voltage to one wire connected to the target memory element and the other half of the read voltage to the other wire connected to the target memory element. This applies the full read voltage to the target memory element while only applying half of the read voltage to half-selected memory elements. Half-selected memory elements are those that are positioned along the same line as a fully selected target memory element. When half of the read voltage is applied to the half-selected memory elements, a current is produced which adds to the current sensed by the reading circuitry used to sense the electric current from the target memory element.

Each half-selected memory element contributes a small amount of unwanted current to sensing circuitry used to sense the current flowing through the target memory element. To limit the amount of electric current contributed by the half-selected memory elements, non-linear devices are used. Generally, it is desirable to use memory elements with a high degree of non-linearity. Using devices with a higher degree of non-linearity allows a memory array with more memory elements along a particular wire line to be produced.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 7 is a flowchart showing an illustrative method for fabricating a crossbar array with MIT switching devices, according to one embodiment of principles described herein.

Throughout the drawings, identical reference numbers designate similar, but not necessarily identical, elements.

DETAILED DESCRIPTION

Figure 1:
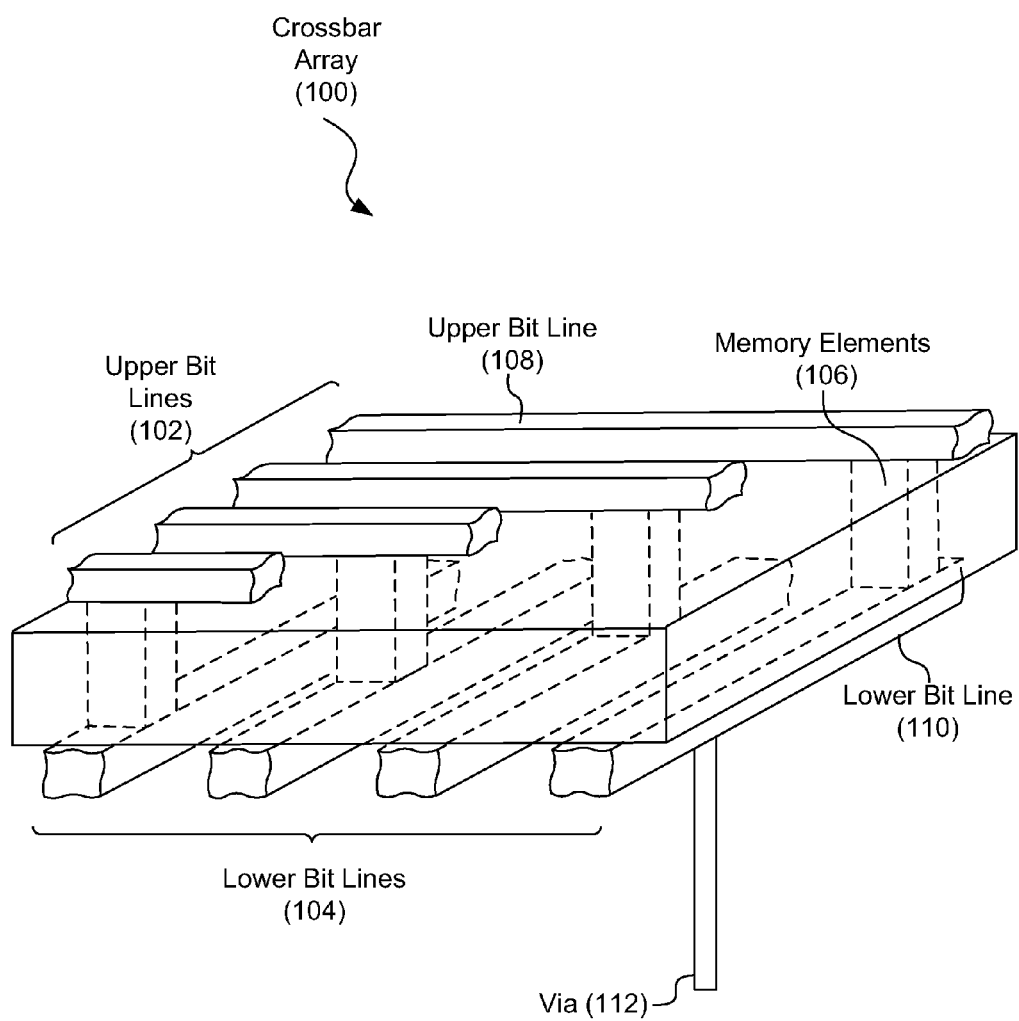
FIG. 1 is a diagram showing an illustrative crossbar array, according to one embodiment of principles described herein.

As mentioned above, particular memory elements within a crossbar array are often read by applying half of a read voltage to one wire connected to the target memory element and the other half of the read voltage to the other wire connected to the target memory element. This applies the full read voltage to the target memory element while only applying half of the read voltage to half-selected memory elements. Half-selected memory elements are those that are positioned along the same line as a fully selected target memory element. When half of the read voltage is applied to the half-selected memory elements, a current is produced which adds to the current sensed by the reading circuitry used to sense the electric current from the target memory element.

Each half-selected memory element contributes a small amount of unwanted current to sensing circuitry used to sense the current flowing through the target memory element. To limit the amount of electric current contributed by the half-selected memory elements, non-linear devices are used. Generally, it is desirable to use memory elements with a high degree of non-linearity. Using devices with a higher degree of non-linearity allows a memory array with more memory elements along a particular wire line to be produced.

In light of this and other issues, the present specification discloses a crossbar memory structure that uses memory elements which include a Metal-Insulator Transition (MIT) material in series with a switching layer. The switching layer is the portion of the memory element which switches between two different states to represent a digital '1' or a digital '0'. The MIT material is used give the memory element a higher degree of non-linearity. More detail on how the MIT material adds non-linearity to the device will be discussed below.

Through use of methods and systems described herein, a crossbar array utilizing highly non-linear memory elements can be realized. This high non-linearity of the memory elements within the crossbar array increases the number of memory elements which can be placed along a particular row line or column line. This allows for greater block sizes and thus more efficient memory structures.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "access voltage" is used to refer to a voltage applied to a memory element to write or read the state of that memory element. The description within this specification will describe operations primarily in terms of read voltages. However, it will be apparent to those skilled in the art that the principles described herein can apply to write voltages as well.

Referring now to the figures, FIG. 1 is a diagram showing an illustrative crossbar memory array architecture (100). According to certain illustrative examples, the crossbar memory array (100) may include an upper set of lines (102) which may generally be in parallel. Additionally, a lower set of lines (104) is generally perpendicular to, and intersects, the upper lines (102). The upper lines and the lower lines may be referred to as word lines or bit lines depending on how data is written to or read from the memory array (100).

Programmable crosspoint or memory devices (106) are formed at the intersections between an upper line (108) and a lower line (110). For purposes of illustration, the upper wires will be referred to as row lines and the lower set of parallel wires will be referred to as column lines. Terms such as row, column, upper, and lower are not used to indicate a specific position or orientation. Rather, the terms are used to distinguish position or orientation relative to one another.

According to certain illustrative examples, the programmable crosspoint devices (106) may be memristive devices. Memristive devices exhibit a "memory" of past electrical conditions. For example, a memristive device may include a matrix material that contains mobile dopants. These dopants can be moved within a matrix to dynamically alter the electrical operation of an electrical device, such as the resistance of that device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field.

As indicated, by changing the dopant configurations within a memristive matrix, the electrical resistance of the device may be altered. The memristive device is then read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar memory array (100) may be used to form a non-volatile memory array. Non-volatile memory has the characteristic of not losing its contents when no power is being supplied. Each of the programmable crosspoint devices (106) is used to represent one or more bits of data. Although individual crossbar lines (108, 110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar memory array (100) may be integrated into a Complimentary Metal-Oxide-Semiconductor (CMOS) circuit or other conventional computer circuitry. Each individual wire segment may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 2A:
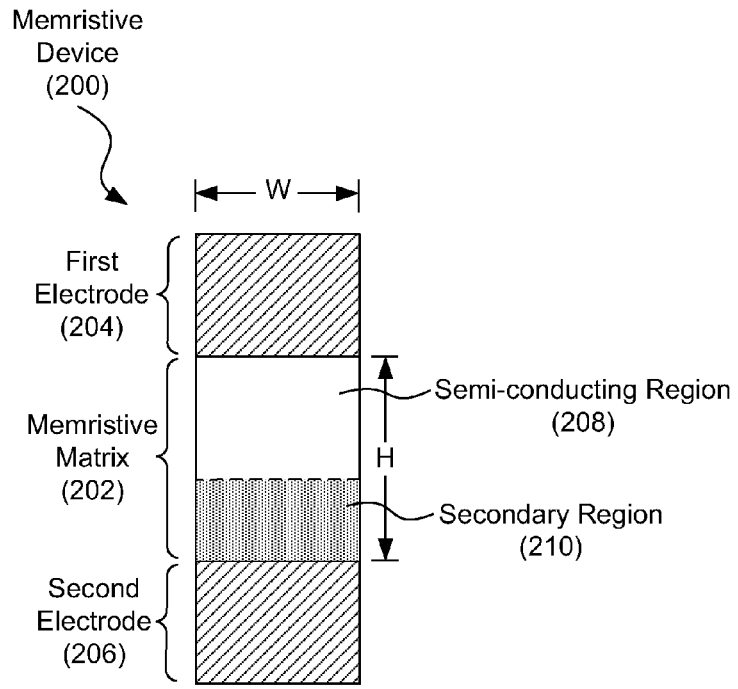
FIGS. 2A-2B are diagrams illustrating the operation of a memristive device, according to one example of principles described herein.

FIG. 2A is diagram showing an illustrative memristive device with no electrical conditions being applied. According to one illustrative example, the memristive device includes a first electrode (204) and a second electrode (206) in electrical and physical contact with a memristive matrix (202). The memristive matrix (202) is initially comprised of two separate regions: a semiconducting region (208) which is not intentionally doped and a highly doped secondary region (210).

Throughout the specification and appended claims, the term "memristive matrix" describes a thin film of material that is electronically semiconducting or nominally electronically insulating and also a weak ionic conductor. The memristive matrix (202) is capable of transporting and hosting ions that act as dopants to control the flow of electrons through the memristive device (200). The basic mode of operation is to apply an electrical field (the drift field, which may exceed a threshold for enabling the motion of the ions in the memristive matrix) across the memristive device (200). The electrical field is large enough to cause an ionic species to be transported within the memristive matrix (202) via ionic transport. The ionic species are specifically chosen from those that act as electrical dopants for the memristive matrix (202), and thereby change the electrical conductivity of the matrix from a high resistive state to a low resistive state. Furthermore, the memristive matrix (202) and the dopant species are chosen such that the drift of the dopants within the memristive matrix (202) is possible but not too facile. This ensures that the memristive device remains in whatever state it is set for a reasonably long time, perhaps many years at room temperature. Thus, the memristive device (200) is nonvolatile. A nonvolatile device is one which holds its state with or without receiving power.

The memristive matrix material (202) may be a thin film (generally less than 200 nm thick), and is in many cases nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electrical field can be produced by a relatively small applied voltage.

Conduction of electrons through the matrix material (202) is frequently dominated by quantum mechanical tunneling of the electrons. When a semiconducting matrix material is essentially intrinsic at a junction with an electrode, the tunneling barrier is high and wide, causing the memristive device to be in a high resistive state. When a significant number of dopant species have been injected into or distributed throughout the semiconductor, the width and perhaps the height of the tunneling barrier are diminished by the potential of the charged species. This results in an increase of the conductivity of the switch, placing the memristive device (200) in a low resistive state.

FIG. 2A illustrates one potential "as manufactured" state of the memristive device (200). The semiconducting region (208) has very few dopants and prevents electrical current from flowing between the two electrodes (204, 206). The secondary region (210) is conductive and serves as a source of dopants which can be moved into the semiconducting region (208) to change the overall electrical conductivity of the memristive matrix (202). Consequently, in the "as manufactured" state of the memristive device illustrated in FIG. 2A, the memristive device (200) is a high resistive state.

The electrodes (204, 206) may be constructed from a variety of conducting materials, including but not limited to: metals, metal alloys, metal composite materials, nanostructured metal materials, or other suitable conducting materials.

The memristive matrix (202) has a height of "H" and a width of "W" as shown in FIG. 2A. For purposes of illustration only, assume that the height "H" is 100 nanometers and the width "W" is approximately 50 nanometers. As discussed above, a relatively intense electrical field can be generated across the thin film of memristive matrix by a relatively small voltage. For example, a dopant may require an electrical field intensity of 100,000 volts per centimeter to move within the matrix. If the distance between two electrodes is 100 nanometers, a voltage bias of only 1 Volt applied across the first electrode (204) and the second electrode (206) will produce the required electrical field intensity of 100,000 volts/centimeter through the memristive material (202). The application of a programming voltage above a certain threshold allows the dopants to be moved through the memristive matrix (202).

Figure 2B:
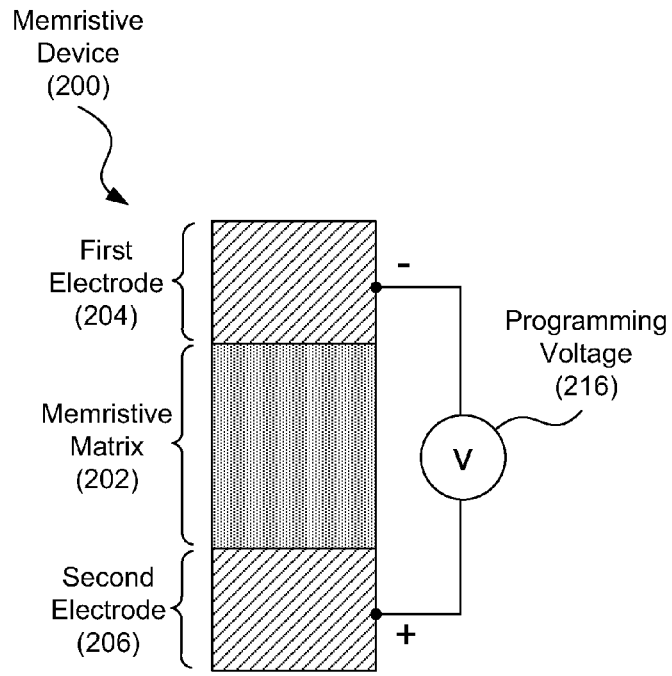

FIG. 2B is a diagram showing the memristive device (200) with a programming voltage (216) applied. The programming voltage (216) results in an electrical field which facilitates not only the movement of dopants from the highly doped region (210) into the intrinsic region (208) but also the creation of some native dopants, such as oxygen vacancies, via an electro-reduction process in oxide memristive materials. The polarity and voltage difference which is applied across the memristive matrix (202) varies according to a variety of factors including, but not limited to: material properties, geometry, dopant species, temperature, and other factors. For example, when the ions are positively charged, the ions are repelled by positive voltage potentials and attracted to negative voltage potentials. For example, a positive voltage may be applied to the second electrode (206) and negative voltage may be applied to the first electrode (204).

According to one illustrative example, the initial application of a programming voltage (216) to the memristive device (200) is used to form the junction and define its characteristics. This initial programming voltage (216) may be higher than other applied voltages used for operational purposes. The initial programming voltage (216) may serve a number of functions which prepare the junction for further use. For example, the programming voltage (216) may result in the initial creation of additional mobile dopants or the migration of the mobile dopants into more active regions of the memristive matrix (202), which reduces the effective thickness of the switching layer and causes an increased electric field with the same applied voltage. In addition, the electric field for dopant drift in the switching process is usually lower than that for dopant creation in the electroforming process. Consequently, lower programming voltages (216) can be subsequently used to move the dopants. This may be done whether or not the memristive device (200) uses an electroforming step.

Figure 3A:
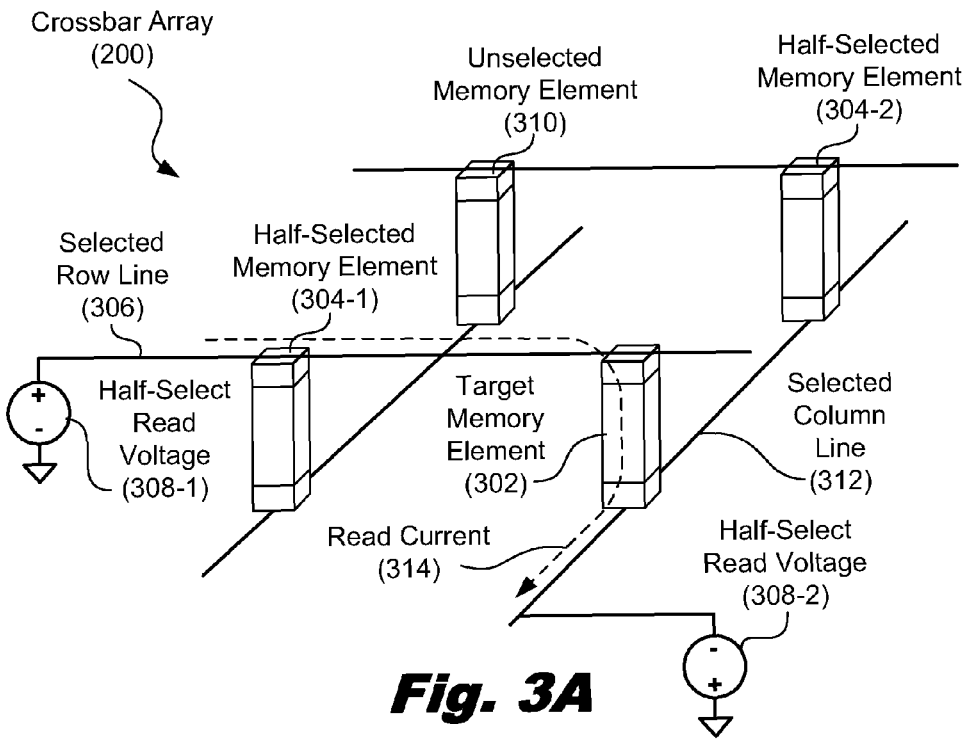
FIGS. 3A-3B are diagrams showing an illustrative section of a crossbar array with a read voltage applied, according to one embodiment of principles described herein.
Figure 3B:
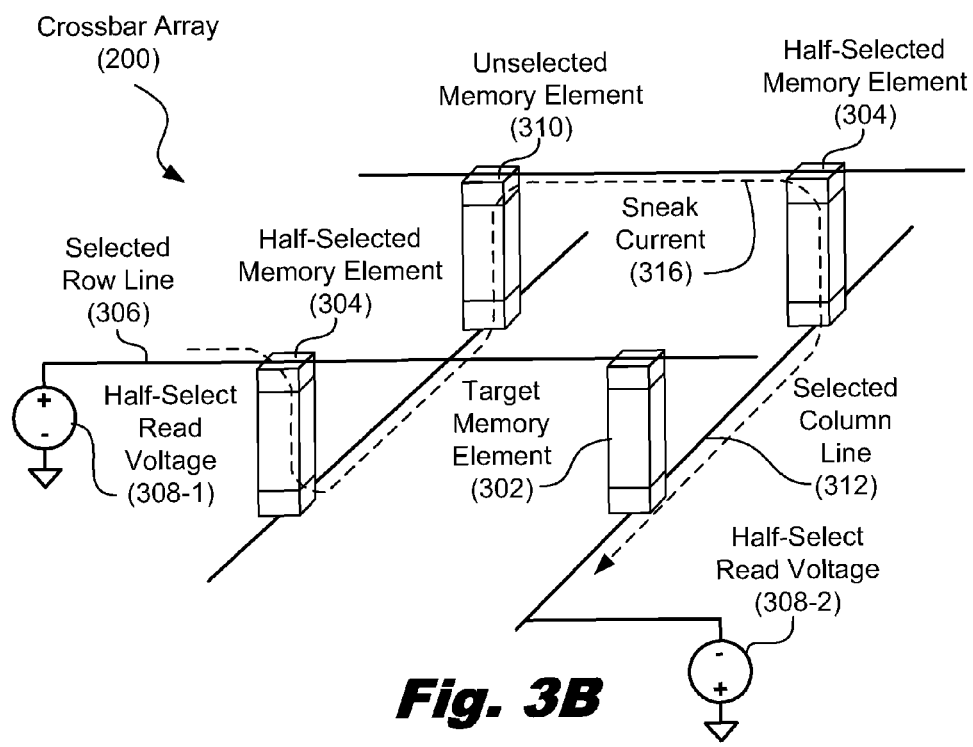

FIGS. 3A-3B are diagrams showing an illustrative section of a crossbar array with a read voltage applied. As mentioned above, a crossbar array is formed by placing memory elements at intersections between row lines and column lines. To access a particular memory element, a voltage is applied across that element. The memory element to be accessed will be referred to as the target memory element (302). The following will describe an example of how to access the target memory element (302) for a reading operation.

To read the state of the target memory element (302), a half-select read voltage (308-1) is applied to the row line (306) connected to the target memory element (302). This row line will be referred to as the selected row line (306). With the half-select read voltage applied, each memory element (304-1) along the selected row line (306), including the target memory element (302) becomes half selected. To fully select the target memory element (302), a half-select read voltage (308-2) is applied to the column line connected to the target memory element (302). This column line will be referred to as the selected column line (312). With the half-select read voltage (308-2) applied to the selected column line (312), the memory elements (304-2) along the selected column line will become half selected, except for the target memory element (302) which becomes fully selected. The half-select read voltage (308-2) applied to the column line (312) will be the inverse polarity of the half-select read voltage (308-1) applied to the selected row line (306). This will cause the voltage drop across the target memory element (302) to be the sum of both half-select read voltages (308-1, 308-2).

The unselected row lines and the unselected column lines may be either grounded or set at a fixed voltage. The manner in which unselected lines are handled may depend on the design of the system.

With the full voltage applied across the target memory element (302), a read current (314) flows through the selected row line (306), the target memory element (302), and the selected column line (312). The value of the read current will be indicative of the state of the target memory element (302). Thus, sensing circuitry can be used to measure the read current and determine whether the target memory element is storing a digital '1' or a digital '0'.

As mentioned above, when applying half-select read voltages to the row lines and column lines, memory elements (304-1, 304-2) along those lines become half selected. This causes an electric current to flow through these memory elements (304) as well.

FIG. 3B illustrates a possible path of a sneak current (314). The value of the sneak current (316) is dependent on the current to voltage relationship of the memory elements. Using memory elements with a higher non-linearity reduces the value of the electric current contributed by each half-selected memory elements (304) to the sneak current (316) or other unselected devices.

A crossbar array embodying principles described herein may be of a variety of dimensions. For example, the number of row lines can be different from the number of column lines.

For example, if the memory elements have a relatively small non-linearity in the current to voltage relationship, then the ratio between current produced by a memory element with the full voltage applied and the current produced by the memory element with the half voltage applied is relatively small. This will cause the half-selected memory elements (304) as well as other unselected memory elements (310) to contribute a relatively large amount of current to the sneak current (316). Conversely, if the memory elements have a high degree of non-linearity, then the ratio between current produced by a memory element with the full voltage applied and the current produced by the memory element with the half voltage applied is relatively large. This will cause each half-selected memory element (304) to contribute a relatively small amount to the sneak current (316). This allows more memory elements to be placed along a particular line without creating too large of a sneak current (316). A large sneak current (316) will interfere with the read current (314) and make it difficult for the sensing circuitry to accurately determine the state of the target memory element (302).

In light of this issue, the present specification discloses a memory element with a high degree of non-linearity which can be used in a crossbar array. Particularly, a highly non-linear element includes a Metal-Insulator Transition (MIT) material. An MIT material is one that can experience a metal-insulator transition under certain conditions such as temperature or the application of electrical conditions such as a voltage or current. Use of memory elements with a high degree of non-linearity allows more memory elements to be placed along a particular row line or column line. This allows larger block sizes of memory. Using a memory array with larger block sizes can increase power efficiency and simplify the mechanisms used to address memory within the array.

Figure 4:
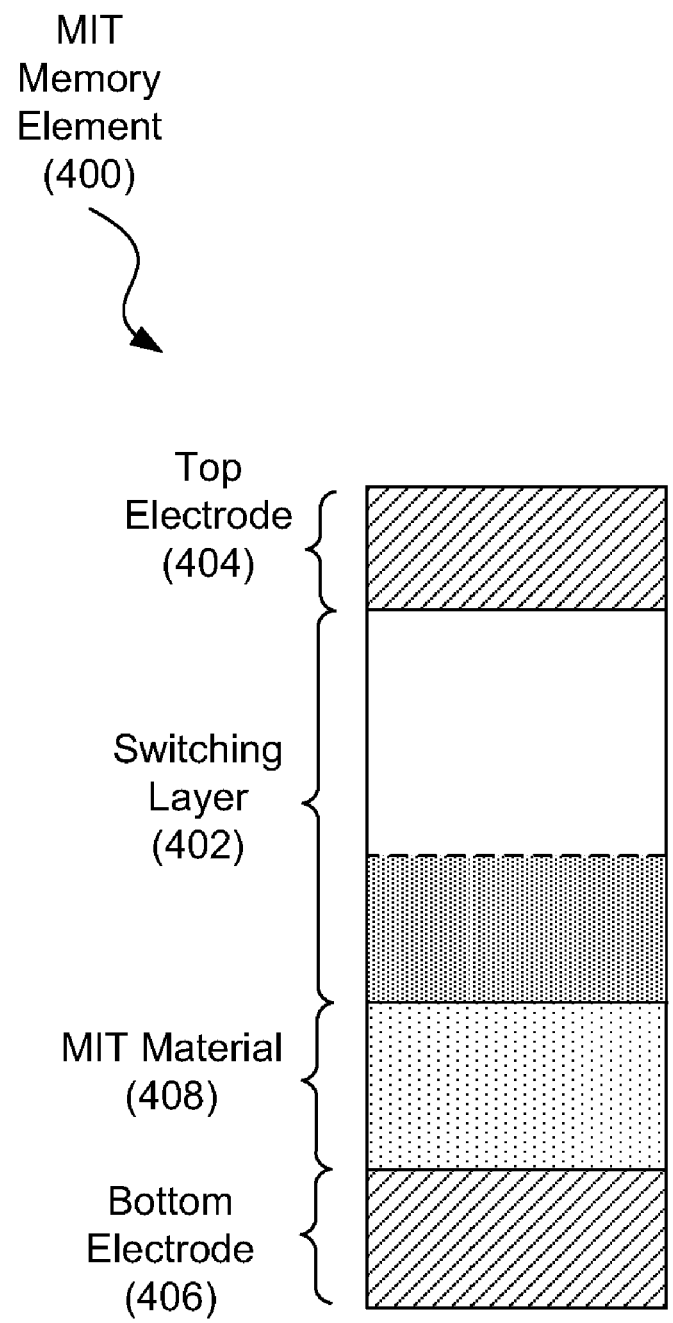
FIG. 4 is a diagram showing an illustrative memristive device with a Metal-Insulator Transition material, according to one example of principles described herein.

FIG. 4A is a diagram showing an illustrative MIT memory element device (400). According to certain illustrative examples, the MIT memory element includes a switching layer (402) in series with an MIT material (412). The switching layer (402) and the MIT material (412) are placed between a top electrode (404) and a bottom electrode (406).

In one example, the switching layer (402) is a memristive matrix as described above in the text accompanying FIG. 2. The switching layer (402) is placed in series with the MIT material (408). In such a configuration, an MIT can be initiated by the application of a current to the device. This occurs when electric current injected between two electrodes connected to the MIT material locally heats the MIT material above a transition temperature. The transition temperature is the temperature at which a solid material changes from one crystal state to another. This rise above the transition temperature causes current filamentation to occur. Current filamentation is an inhomogeneity in the current density distribution orthogonal to the direction of current flow. This current filamentation leads to current-controlled negative differential resistance (NDR). It is this NDR that increases the non-linearity of the MIT memory element (400).

In some cases, the MIT can be initiated by a change in temperature. For example, a material may exhibit MIT characteristics at certain temperatures. The temperature of the MIT material can be heated or cooled to initiate the NDR characteristics at the appropriate time. This change in temperature may be brought about through a variety of methods. One method, as mentioned above, is the application of an electric current.

The MIT material can be a variety of metal oxides including, but not limited to, vanadium oxide materials, iron oxide materials, niobium oxide materials, titanium oxide materials, and manganese oxide materials.

Figure 5:
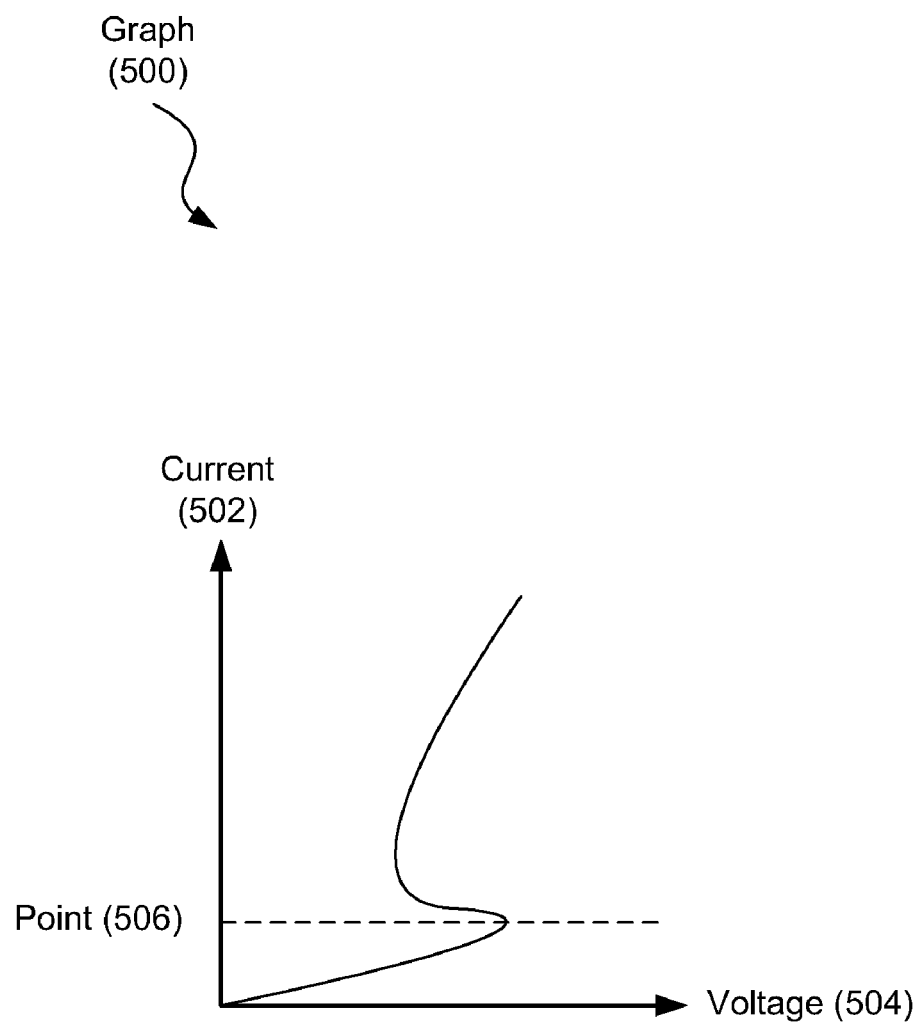
FIG. 5 is a diagram showing an illustrative graph showing a current to voltage relationship of a Metal-Insulator Transition (MIT) device, according to one embodiment of principles described herein.

FIG. 5 is a diagram showing an illustrative graph showing a current to voltage relationship of an MIT device. The vertical axis represents electric current (502) and the horizontal axis represents voltage (504).

As mentioned above, under certain conditions, an MIT device can exhibit NDR. A device which exhibits NDR will experience a decrease in voltage at certain levels of increasing current. This creates an 'S' shaped curve in the current-to-voltage relationship as indicated in the graph (500). Starting from the origin of the graph, as the electric current applied to the device increases, the voltage also increases until the current level reaches the point (506). At the point (506), the temperature of the MIT material (e.g. 408, FIG. 4) passes the transition temperature as described above. This turns the MIT material into what will be referred to as an ON state. As will be described in more detail below, the ON state corresponds to the more conductive region of the current to voltage curve for the MIT memory element (400).

While the MIT material is in the ON state, the voltage to current ratio is substantially smaller than it is in the OFF state. This results in a smaller voltage drop across the MIT memory element (400) for a given applied electric current. Thus, the MIT memory element is no longer acting as a current limiting device.

Figure 6:
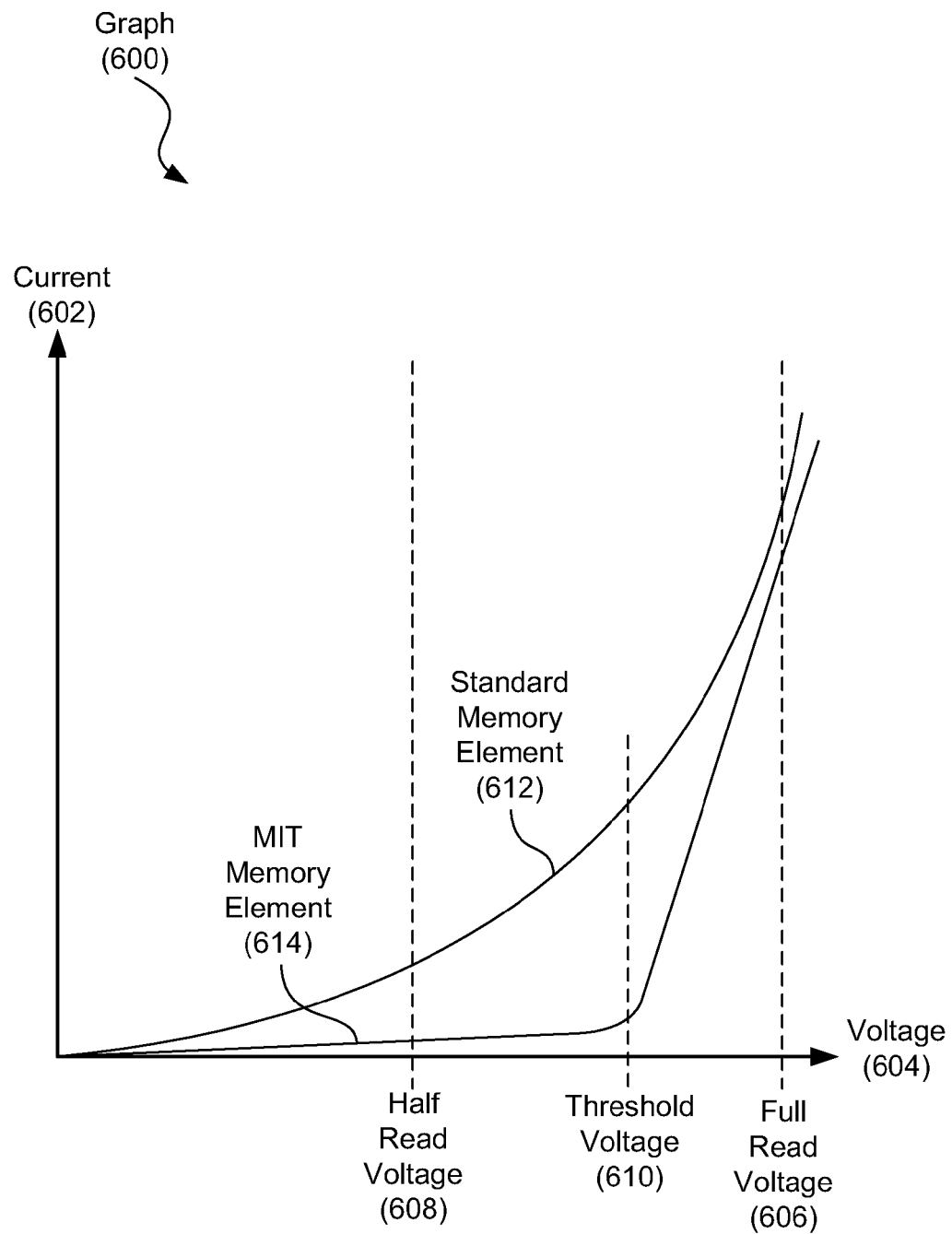
FIG. 6 is a diagram showing an illustrative graph comparing current to voltage relationships of switching devices, according to one embodiment of principles described herein.

FIG. 6 is a diagram showing an illustrative graph comparing current to voltage relationships of switching devices. Particularly, FIG. 6 compares the non-linearity of a memory element without the MIT material in series and with the MIT material in series. The vertical axis of the graph represents electric current (602) and the horizontal axis of the graph represents voltage (604).

The current to voltage curve of the standard memory element (612) indicates the non-linearity of the switching layer. However, this non-linearity is relatively small compared to the non-linearity of the MIT memory element (614). Starting at the origin, as the current increases, the voltage increases substantially along the MIT memory element curve (614). This is due to the high resistance of the device. When the voltage passes a threshold voltage (610), the MIT material is put into the ON state and the resistance drops rapidly. This causes the voltage drop across the MIT memory element to be smaller than it is at lower operating currents. Thus, the device exhibits a high degree of non-linearity.

The current to voltage relationship of the MIT memory element (614) shows that when the half read voltage (608) is applied, the current flowing through the device is very small compared to the current flowing through the device when the full read voltage (606) applied. This larger discrepancy in current between the half read voltage application (608) and the full read voltage (606) application allows more memory elements to be placed along a particular line.

FIG. 7 is a flowchart showing an illustrative method for fabricating a crossbar array with MIT switching devices. According to certain illustrative examples, the method includes applying (block 702) half of an access voltage to a row line connected to a target memory element, the target memory element comprising a switching layer in series with an MIT material; applying (704) an inverted half of the access voltage to a column line connected to the target memory element; and detecting (block 706) the electric current flowing through the target memory element to determine the state of the target memory element.

Through use of methods and systems described herein, a crossbar array utilizing highly non-linear memory elements can be realized. This high non-linearity of the memory elements within the crossbar array increases the number of memory elements which can be placed along a particular row line or column line. This allows for greater block sizes and thus more efficient memory structures.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memory array with Metal-Insulator Transition (MIT) switching devices, the memory array comprising:
   a set of row lines intersecting a set of column lines; and
   a memory element disposed at an intersection between one of said row lines and one of said column lines;
   in which said memory element comprises a switching layer in series with an MIT material, wherein said switching layer is a memristive switching layer.

2. The memory array of claim 1, in which said memristive switching layer comprises an intrinsic semiconductor region and a highly doped secondary region.

3. The memory array of claim 1, further comprising a voltage supply to apply an access voltage across said memory element.

4. The memory array of claim 3, in which said access voltage is one of: a read voltage and a write voltage.

5. The memory array of claim 3, in which to apply said access voltage, half of said access voltage is applied to said row line connected to said memory element and an inverted half of said access voltage is applied to said column line connected to said memory element.

6. The memory array of claim 5, in which to read a state of said memory element, said half of said access voltage is less than a threshold voltage required to change a state of said switching layer.

7. The memory array of claim 1, in which said MIT material comprises at least one of: a vanadium oxide material, a niobium oxide material, an iron oxide material, a manganese oxide material, and a titanium oxide material.

8. A method of accessing a target memory element within a memory array, the method comprising:
applying half of an access voltage to a row line connected to said target memory element, said target memory element comprising a switching layer in series with a Metal-Insulator Transition (MIT) material; and
applying an inverted half of said access voltage to a column line connected to said target memory element.

9. The method of claim 8, further comprising, detecting the electric current flowing through said target memory element to determine a state of said target memory element.

10. The method of claim 8, in which said switching layer is a memristive switching layer.

11. The method of claim 9, in which said memristive switching layer comprises an intrinsic semiconductor region and a highly doped secondary region.

12. The method of claim 8, in which said access voltage is one of: a read voltage and a write voltage.

13. The method of claim 8, in which to read a state of said memory element, said half of said access voltage is less than a threshold voltage required to change a state of said switching layer.

14. The method of claim 8, in which said MIT material comprises at least one of: a vanadium oxide material, a niobium oxide material, an iron oxide material, a manganese oxide material, and a titanium oxide material.

15. A memory array comprising:
addressing circuitry; and
a number of memory blocks, at least one of said memory blocks comprising:
a number of row lines;
a number of column lines intersecting said number of row lines; and
memory elements disposed at intersections between said column lines and said row lines, said memory elements comprising a switching layer in series with a Metal-Insulator Transition (MIT) material, wherein said switching layer is a memristive switching layer.

16. The memory array of claim 15, in which said memristive switching layer comprises an intrinsic semiconductor region and a highly doped secondary region.

17. The memory array of claim 15, further comprising a voltage supply to apply an access voltage to one of said memory elements, said access voltage being one of: a read voltage and a write voltage.

18. The memory array of claim 17, in which to apply said access voltage to said one of said memory elements, half of said access voltage is applied to one of said row lines connected to said one of said memory elements and an inverted half of said access voltage is applied to one of said column lines connected to said one of said memory elements.

19. The memory array of claim 15, in which said MIT material comprises at least one of: a vanadium oxide material, a niobium oxide material, an iron oxide material, a manganese oxide material, and a titanium oxide material.

* * * * *